(12) United States Patent
Abell et al.

(10) Patent No.: US 8,325,183 B2
(45) Date of Patent: Dec. 4, 2012

(54) SYSTEM AND METHOD FOR DETERMINING A POSITION FOR AN ADDENDUM MESH NODE

(75) Inventors: Jeffrey A. Abell, Rochester Hills, MI (US); Thomas J. Oetjens, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 856 days.

(21) Appl. No.: 12/433,514

(22) Filed: Apr. 30, 2009

(65) Prior Publication Data

US 2010/0278375 A1 Nov. 4, 2010

(51) Int. Cl.
*G06T 15/30* (2011.01)
*G06G 7/48* (2006.01)
*G09G 5/00* (2006.01)

(52) U.S. Cl. .......... 345/423; 29/893.34; 703/7; 345/606

(58) Field of Classification Search .......... None
See application file for complete search history.

(56) References Cited

U.S. PATENT DOCUMENTS

| | | | |
|---|---|---|---|
| 7,894,929 B2 * | 2/2011 | Hillmann et al. | 700/145 |
| 2006/0293776 A1 * | 12/2006 | Hillman et al. | 700/98 |
| 2007/0173964 A1 * | 7/2007 | Ren et al. | 700/98 |

OTHER PUBLICATIONS

Dy Chi; Liu Ruijun; Hu Ping; Song Yuquan; , "Smoothing Parametric Method to Design Addendum Surface," Intelligent Computation Technology and Automation (ICICTA), 2008 International Conference on , vol. 1, no., pp. 1140-1144, Oct. 20-22, 2008.*
Smith, G. B. 1984. A fast surface interpolation technique. In Proceedings of the Image Understanding Workshop (New Orleans, LA., Oct. 3-4). DARPA, Science Applications, McLean, VA., pp. 211-215.*

* cited by examiner

*Primary Examiner* — Kee M Tung
*Assistant Examiner* — Zhengxi Liu
(74) *Attorney, Agent, or Firm* — Ingrassia Fisher & Lorenz, P.C.

(57) ABSTRACT

Systems and Methods are provided for determining a position of an addendum mesh node disposed between a part mesh boundary and a binder mesh boundary with respect to a first plane. The method includes selecting a first point on the part mesh boundary and a second point on the binder mesh boundary having positions with respect to the first plane that are disposed on a control line which also intersects the position of the addendum mesh node with respect to the first plane, identifying a plurality of control points having positions with respect to the first plane that are disposed on the control line, and generating an interpolated curve that intersects the first point, the second point, and the plurality of control points. The method further includes adjusting the position of at least one of the plurality of control points with respect to a second plane that is substantially orthogonal to the first plane and repeating the step of generating the interpolated curve until the interpolated curve is tangentially correlated to the first point and to the second point. Finally, a position on the interpolated curve is identified that corresponds to the position of the addendum mesh node with respect to the first plane.

16 Claims, 10 Drawing Sheets

SYSTEM AND METHOD FOR DETERMINING A POSITION FOR AN ADDENDUM MESH NODE

TECHNICAL FIELD

The present invention generally relates to the development of tools for manufacturing formed sheet metal parts, and more particularly relates to a system and method for determining a position for an addendum mesh node.

BACKGROUND OF THE INVENTION

Formed sheet metal parts are manufactured using a deep-drawing process in which a planar sheet metal blank (hereinafter, a "blank") is pressed into a desired three-dimensional shape using a multi-part pressing tool. Typically, the pressing tool includes three independent parts: a die, a binder, and a punch. The die comprises an inner cavity for receiving the punch. During the deep-drawing process, a first portion of the blank is clamped between the binder and the edge zones of the die cavity while the punch is lowered into the die cavity, stretching and forming a second portion of the blank into the shape of the part. As a result, the blank (hereinafter, a "drawn blank") is transformed into a three-dimensional shape that includes three component geometries: a binder geometry comprising the first portion of the blank, a part geometry comprising the second portion of the blank, and an addendum geometry extending between the binder geometry and the part geometry.

Deep-drawing processes for new products are often simulated on a computing system, such as a Computer Aided Design (CAD) system, before the pressing tool is developed and tested. During this simulation, the desired part geometry for the drawn blank is determined by a design engineer using a CAD system. Corresponding binder and addendum geometries are also determined based on known characteristics of the desired part material and the deep-drawing process. These determined component geometries may then be utilized to determine the appropriate dimensions and surfaces for the pressing tool components (e.g., the die, the binder, and the punch).

With respect to the determination of the component geometries for a drawn blank, the development of an appropriate addendum geometry presents a significant issue for the design engineer. The addendum geometry must be correlated to the part geometry and to the binder geometry to avoid undesirable results, such as tearing or wrinkling, in a drawn blank. Determining the dimensions of an addendum geometry that provides such a precise transition between the binder and part geometries can be a very time consuming process, often requiring the efforts of multiple design engineers. Consequently, the development of addendum geometries can have a significant impact on the costs associated with developing a new product.

Accordingly, it is desirable to provide a system and a method for quickly identifying an addendum geometry that provides a precise transition between corresponding part and binder geometries. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A method is provided for determining a position of an addendum mesh node disposed between a part mesh boundary and a binder mesh boundary with respect to a first plane. The method includes selecting a first point on the part mesh boundary and a second point on the binder mesh boundary having positions with respect to the first plane that are disposed on a control line which also intersects the position of the addendum mesh node with respect to the first plane, identifying a plurality of control points having positions with respect to the first plane that are disposed on the control line, and generating an interpolated curve that intersects the first point, the second point, and the plurality of control points. The method further includes adjusting the position of at least one of the plurality of control points with respect to a second plane that is substantially orthogonal to the first plane and repeating the step of generating the interpolated curve until the interpolated curve is tangentially correlated to the first point and to the second point. Finally, a position on the interpolated curve is identified that corresponds to the position of the addendum mesh node with respect to the first plane.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description. It should also be understood that FIGS. 1-10 are merely illustrative and may not be drawn to scale.

Figure 1:
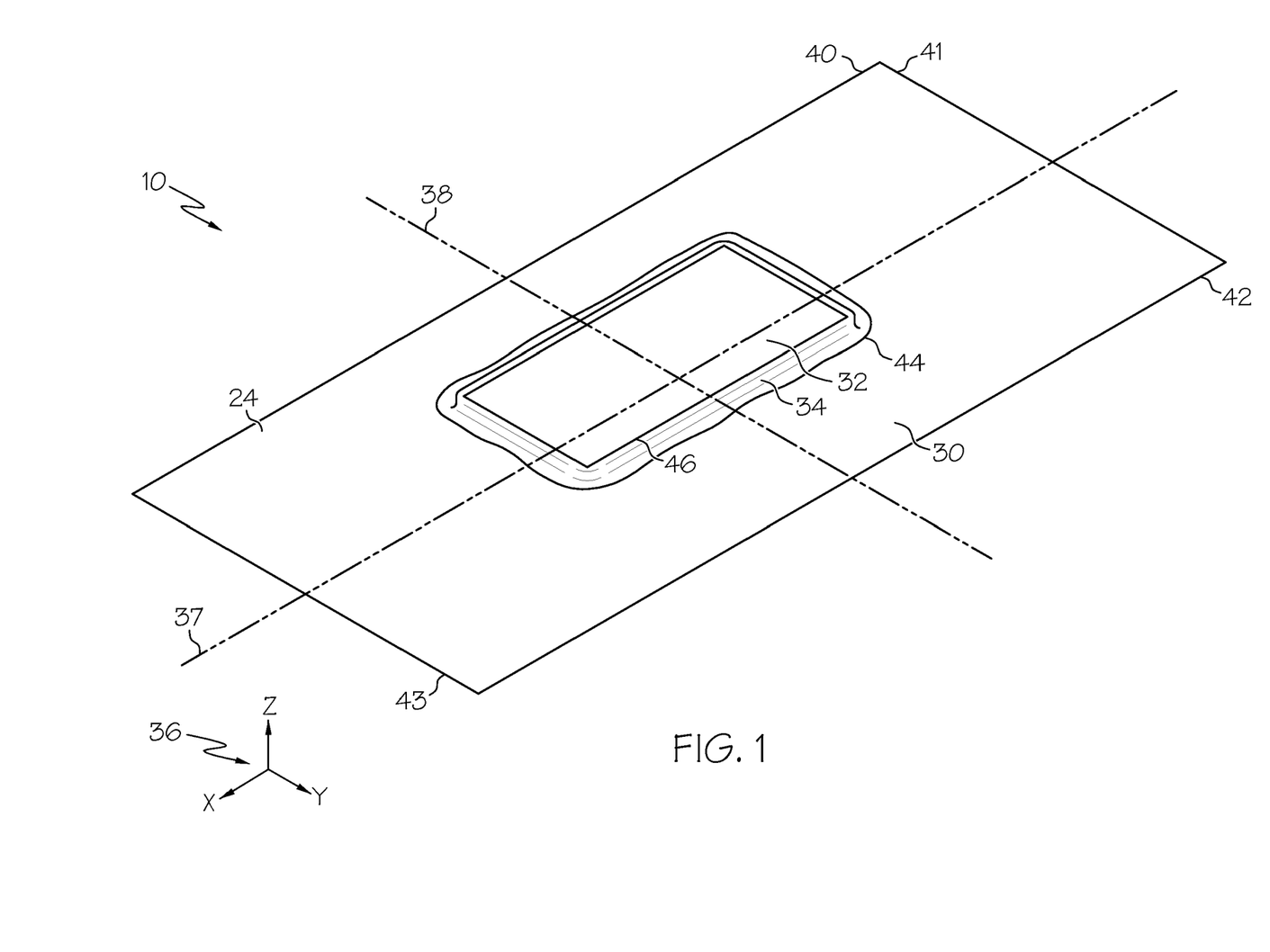
FIG. 1 is a perspective view of an exemplary drawn blank.

FIG. 1 is a perspective view of an exemplary drawn blank 10. Drawn blank 10 includes a first surface 24 that comprises three component geometries: a binder geometry 30, a part geometry 32, and an addendum geometry 34. As described above, component geometries 30, 32, 34 are created during a deep-drawing process in which a planar blank is transformed into drawn blank 10 by a multi-part pressing tool. The pressing tool includes a punch, a die having a cavity formed therein for receiving the punch, and a binder for securing the blank to the edge zones of the die cavity.

For clarity and convenience, drawn blank 10 is oriented within a coordinate system 36 having substantially orthogonal x, y, and z-axes. Components of the multi-part pressing tool (e.g., the binder and the punch) move in a direction (hereinafter, the "vertical direction") that is substantially parallel to the z-axis of coordinate system 36. Further, the xy-plane of coordinate system 36 is substantially parallel to a plane (hereinafter, the "horizontal plane") formed by the longitudinal axis 37 and latitudinal axis 38 of drawn blank 10.

Binder geometry 30 comprises the portion of drawn blank 10 that is clamped between the binder and edge zones of the die cavity during the deep-drawing process. As shown, binder geometry 30 extends between the edges 40, 41, 42, and 43 of drawn blank 10 and a punch opening line 44. Punch opening line 44 substantially corresponds to the boundary of the die cavity.

Part geometry 32 is radially drawn into the die cavity by the punch during the deep-drawing process, stretching and forming part geometry 32 into a desired shape. The punch moves in the vertical direction (e.g., substantially parallel to the z-axis of coordinate system 36) and displaces part geometry 32 away from binder geometry 30 in substantially the same direction. Part geometry 32 is surrounded by a trim line 46 that is cut during a later stage of the production process, enabling part geometry 32 to be extracted from drawn blank 10.

Finally, addendum geometry 34 extends between punch opening line 44 and trim line 46. As described above, addendum geometry 34 should be correlated with binder geometry 30 and part geometry 32 to avoid undesirable results during the deep-drawing process.

Figure 2:
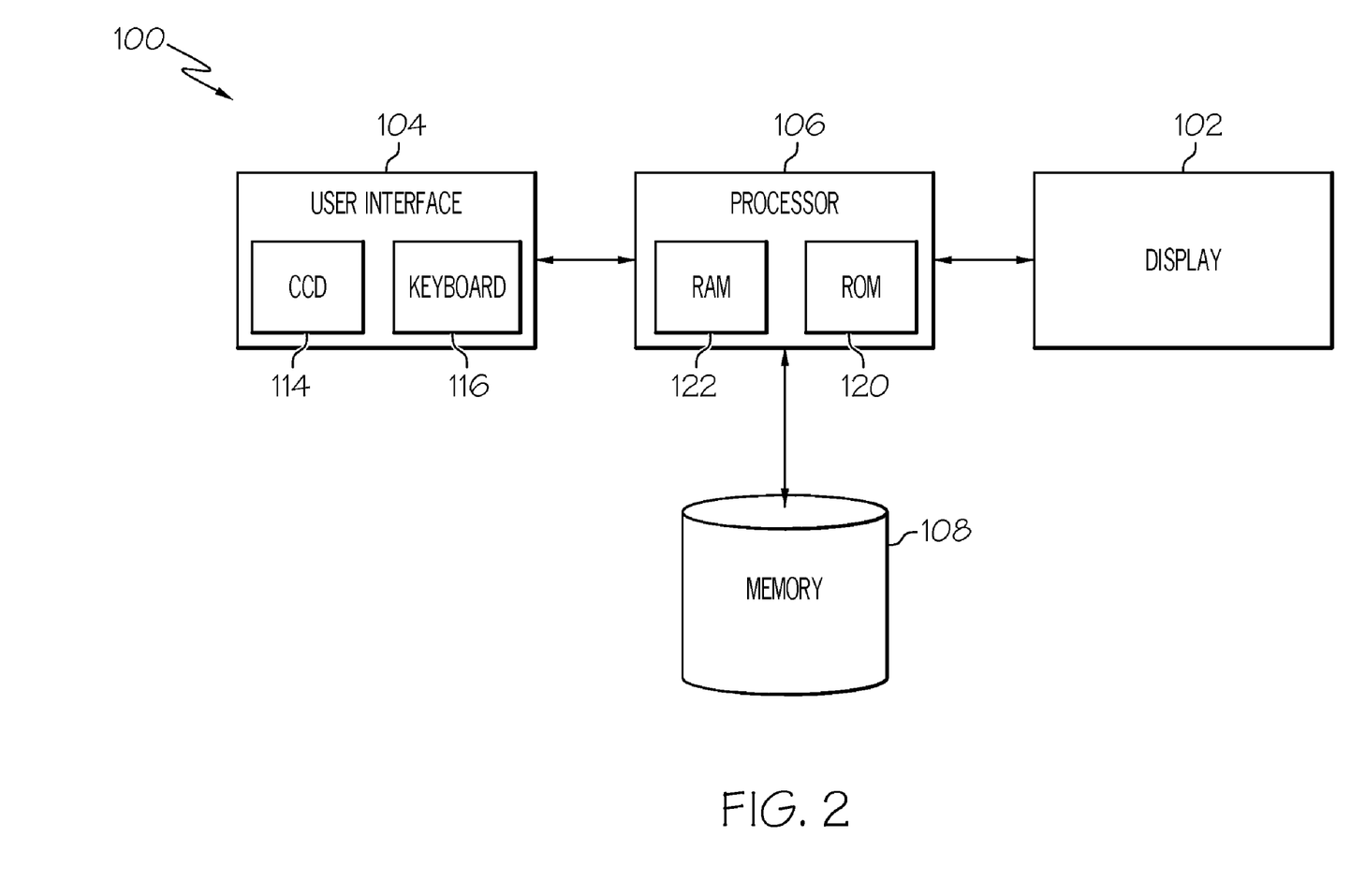
FIG. 2 is a functional block diagram of an exemplary system for generating a finite element mesh that corresponds to a drawn blank.

FIG. 2 is a functional block diagram of an exemplary system 100 that may be used to generate a finite element mesh (FIG. 3) that describes the desired shape of a drawn blank (e.g., drawn blank 10 of FIG. 1). In the depicted embodiment, system 100 includes a display device 102, an input interface 104, a processor 106, and memory 108. Display device 102 is in operable communication with processor 106 and, in response to display commands received therefrom, displays various images. It will be appreciated that display device 102 may be any one of numerous known displays suitable for rendering graphic, iconic, and/or textual images in a format viewable by a user.

Input interface 104 is in operable communication with processor 106 and is configured to supply various signals to processor 106 based on input received from a user. Input interface 104 may be any one, or combination, of various known user interface devices including, but not limited to, a cursor control device (CCD), such as a mouse, a trackball, or joystick, and/or a keyboard, one or more buttons, switches, or knobs. In the depicted embodiment, input interface 104 includes a CCD 114 and a keyboard 116. A user may utilize CCD 114 to, among other things, move a cursor symbol over, and select, various items rendered on display device 102, and may utilize keyboard 116 to, among other things, input various data.

Processor 106 is in operable communication with display device 102, input interface 104, and memory 108 via one or more non-illustrated cables and/or busses. Processor 106 is configured to be responsive to user input supplied via input interface 104 and to command display device 102 to render various graphical, icon, and/or textual images. In addition, processor 106 is configured to selectively retrieve software modules and/or other data from memory 108 to, among other things, generate a finite element mesh describing the shape of a drawn blank in accordance with one or more of the methods described below.

Processor 106 may include one or more microprocessors, each of which may be any one of numerous known general-purpose microprocessors or application specific processors that operate in response to program instructions. In the depicted embodiment, processor 106 includes on-board RAM (random access memory) 120 and on-board ROM (read only memory) 122. The program instructions that control the processor 106 may be stored in either or both the RAM 120 and the ROM 122, or in memory 108.

Memory 108 has various data stored thereon, including software modules, libraries, and other data that may be used by processor 106 to implement or perform one or more of the methods described below. In addition, processor 106 may utilize data stored in memory to implement or perform various CAD and/or modeling techniques. It will be appreciated that the memory 108 may be implemented using any one or more of numerous suitable devices for receiving and storing data, including static memory, magnetic disks, hard drives, floppy drives, thumb drives, compact disks, CD-ROM, DVD-ROM, magnetic tape, solid state memory devices, or combinations thereof. The data may be stored on separate memory devices or in separate sections of a common memory device. Further, memory 108 may be disposed within the same structural casing as processor 106 and/or display device 102, or it may be disposed separately therefrom. It will additionally be appreciated that processor 106 and memory 108 may be in operable communication via a local wired or wireless local area network connection or via a wide area network connection.

Figure 3:
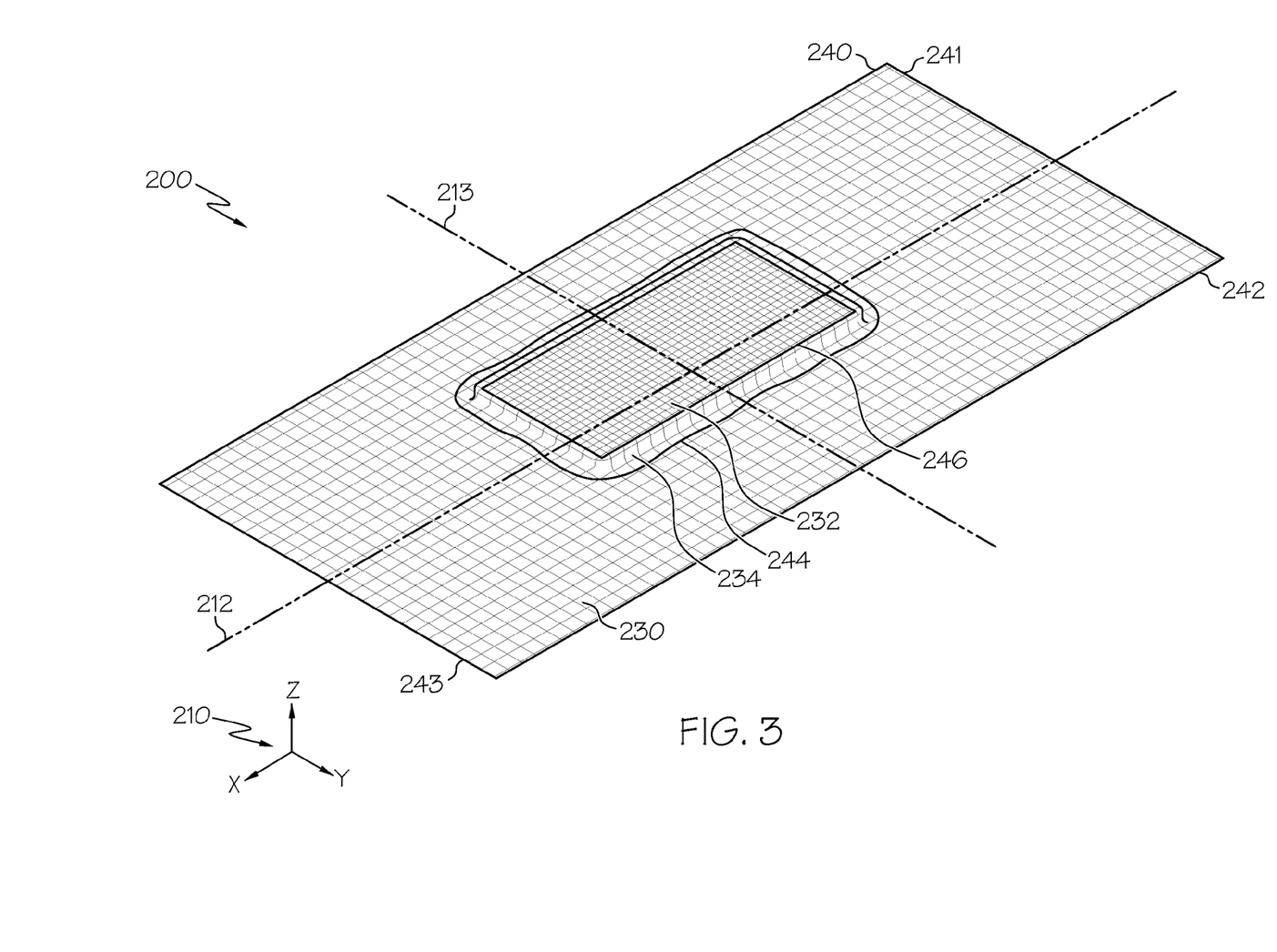
FIG. 3 is a perspective view of a finite element mesh that corresponds to the drawn blank of FIG. 1.

FIG. 3 is perspective view of a finite element mesh 200 that corresponds to a drawn blank (e.g., drawn blank 10 of FIG. 1). Mesh 200 is a discretized model of the surface (e.g., surface 24 of FIG. 1) of the drawn blank and includes a plurality of finite nodes having unique positions within coordinate system 210. Each node is associated with a surface normal represented by a vector having a direction that is substantially perpendicular to the corresponding point on the surface of the drawn blank. For clarity and convenience, mesh 200 is oriented within a coordinate system 210 having substantially orthogonal x, y, and z-axes. The xy-plane of coordinate system 210 is substantially parallel to the horizontal plane of mesh 200 (e.g., the plane that is formed by the longitudinal axis 212 and the latitudinal axis 213 of mesh 200).

Mesh 200 comprises three component meshes: a binder mesh 230, a part mesh 232, and an addendum mesh 234. Binder mesh 230 includes a plurality of mesh nodes (hereinafter, the "binder mesh nodes") that cumulatively describe the shape of a corresponding binder geometry (e.g., binder geometry 30 of FIG. 1). Binder mesh 230 is disposed between the edges 240, 241, 242, and 243 of mesh 200 and a boundary (hereinafter, the "binder mesh boundary") 244 that separates binder mesh 230 from addendum mesh 234. The position of binder mesh boundary 244 substantially corresponds to the position of the punch opening line (e.g., punch opening line 44 of FIG. 1) for the corresponding drawn blank. As further discussed below, certain binder mesh nodes (hereinafter, the "binder mesh edge nodes") are disposed on binder mesh boundary 244.

Part mesh 232 includes a plurality of nodes (hereinafter, the "part mesh nodes") that cumulatively describe the shape of a corresponding part geometry (e.g., part geometry 32 of FIG. 1). In some embodiments, part mesh 232 has a finer mesh resolution than binder mesh 230 and addendum mesh 234, enabling part mesh 232 to more precisely describe the part geometry. Part mesh 232 is disposed within a boundary (hereinafter, the "part mesh boundary") 246 that separates part mesh 232 from addendum mesh 234. The position of part mesh boundary 246 substantially corresponds to the position of the trim line (e.g., trim line 46 of FIG. 1) for the corresponding drawn blank. As further discussed below, certain part mesh nodes (hereinafter, the "part mesh edge nodes") are disposed on part mesh boundary 246.

Addendum mesh 234 includes a plurality of nodes (hereinafter, the "addendum mesh nodes") that cumulatively describe the shape of a corresponding addendum geometry (e.g., addendum geometry 34 of FIG. 1). As shown, addendum mesh 234 is disposed between binder mesh boundary 244 and part mesh boundary 246. In addition, As further described below, addendum mesh 234 is correlated to part mesh 232 and to binder mesh 230 providing a smooth transition between both component meshes.

Mesh 200 is created during the development and simulation of a deep-drawing process for producing a drawn blank (e.g., drawn blank 10 of FIG. 1) having a desired part geometry. In one embodiment, mesh 200 is generated by processor 106 (FIG. 2) that performs or executes one or more of the methods described below in response to input from a user of system 100 (FIG. 2) and/or based on data stored in memory 108 (FIG. 2). However, it should be noted that binder mesh 230, part mesh 232, and/or addendum mesh 234 may also be generated using various other hardware, software, and/or firmware components configured to perform or execute one of the methods described below.

Figure 4:
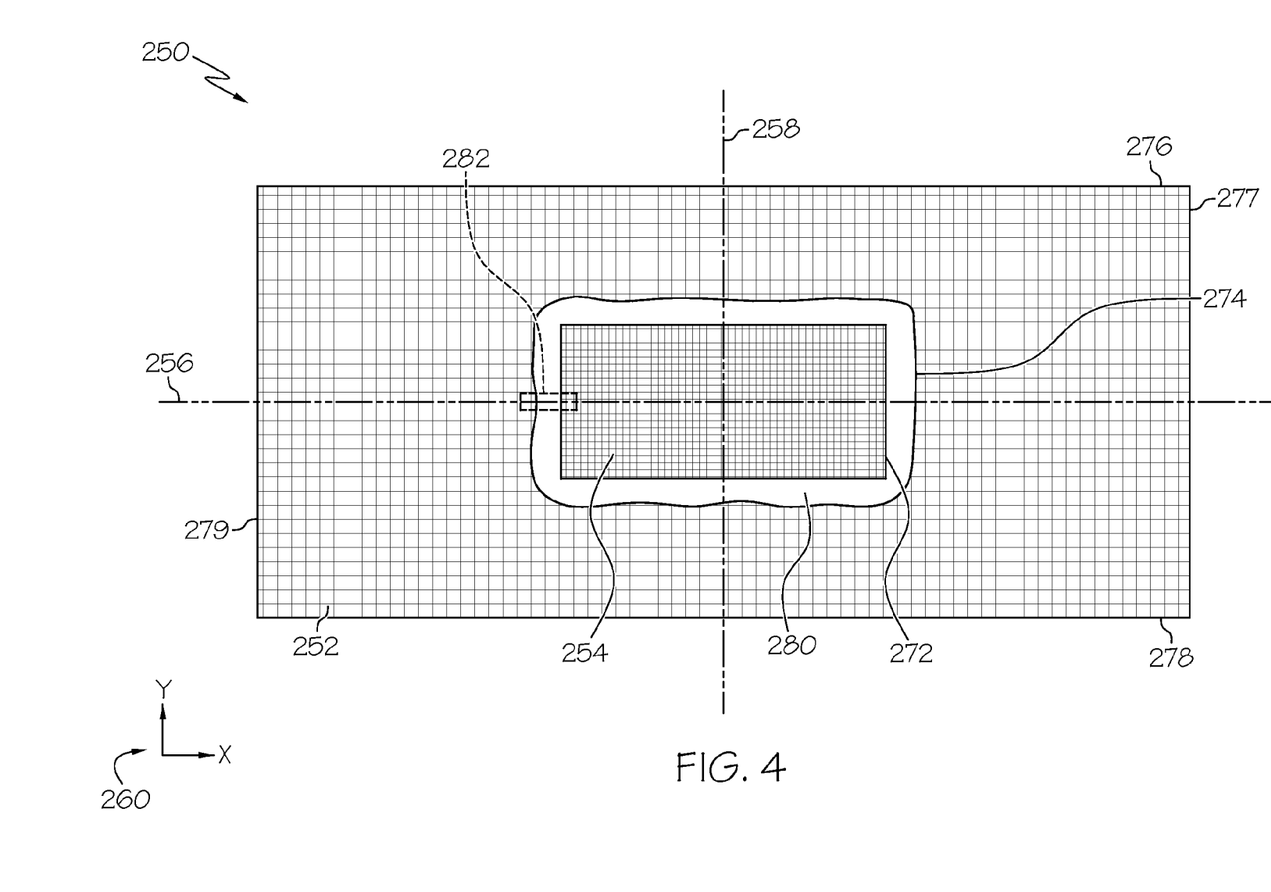
FIG. 4 is a top plan view of a partial finite element mesh that includes a binder mesh and a part mesh.

FIG. 4 is a top plane view of a partial mesh 250 that includes a binder mesh 252 and a part mesh 254. Partial mesh 250 is generated during the creation of a finite element mesh (e.g., mesh 200 of FIG. 3) for a drawn blank. In one embodiment, part mesh 254 is generated first based on predetermined dimensions for the desired part geometry of the drawn blank. The corresponding binder mesh 252 is then generated based on the shape of part mesh 254 and known properties of the deep-drawing process. As depicted, partial mesh 250 is viewed along an axis that is substantially perpendicular to a horizontal plane formed by the longitudinal axis 256 and latitudinal axis 258 of partial mesh 250. The xy-plane of coordinate system 260 is substantially parallel to the horizontal plane of partial mesh 250. Accordingly, positions within partial mesh 250 are viewed, and will be described herein, with reference to the xy-plane of coordinate system 260 (e.g., as though each position were projected onto the xy-plane of coordinate system 260).

Part mesh 254 is disposed within a part mesh boundary 272 and binder mesh 252 is disposed between a binder mesh boundary 274 and edges 276, 277, 278, 279 of partial mesh 250. An unoccupied region 280 is disposed between part mesh boundary 272 and binder mesh boundary 274. Methods are provided below for generating an addendum mesh (e.g., addendum mesh 234) within unoccupied region 280. These methods provide various stages, steps, and/or functions that may be performed or executed by a processor (e.g., processor 106 of FIG. 2) to determine the positions for a plurality of addendum mesh nodes within an addendum mesh that is tangentially correlated to part mesh 254 and binder mesh 252. It should be noted that although exemplary embodiments are described below with regard to a reference area 282 within partial mesh 250, substantially similar methods may be utilized to determine the positions of addendum mesh nodes within other portions of partial mesh 250.

In one embodiment, the position of an addendum mesh node is determined in two steps. During the first step, a first position (hereinafter, the "xy-position") is selected on a first plane (e.g., the xy-plane) that is substantially parallel to the horizontal plane of partial mesh 250. Next, a corresponding second position (hereinafter, the "z-position") is identified on a second plane that is substantially orthogonal to the first plane. The xy-position and the z-position provide the coordinates of a point within coordinate system 260 that corresponds to the position of the addendum mesh node.

The xy-position may be any position within region 280. In one embodiment, the xy-position for each addendum mesh node is determined by generating a preliminary addendum mesh that includes a plurality of addendum mesh nodes having xy-positions that are disposed within region 280. However, it will be understood by one skilled in the art that the xy-position for an addendum mesh node may be generated using other techniques for selecting a position on the xy-plane of coordinate system 260 that is disposed within region 280.

Figure 5:
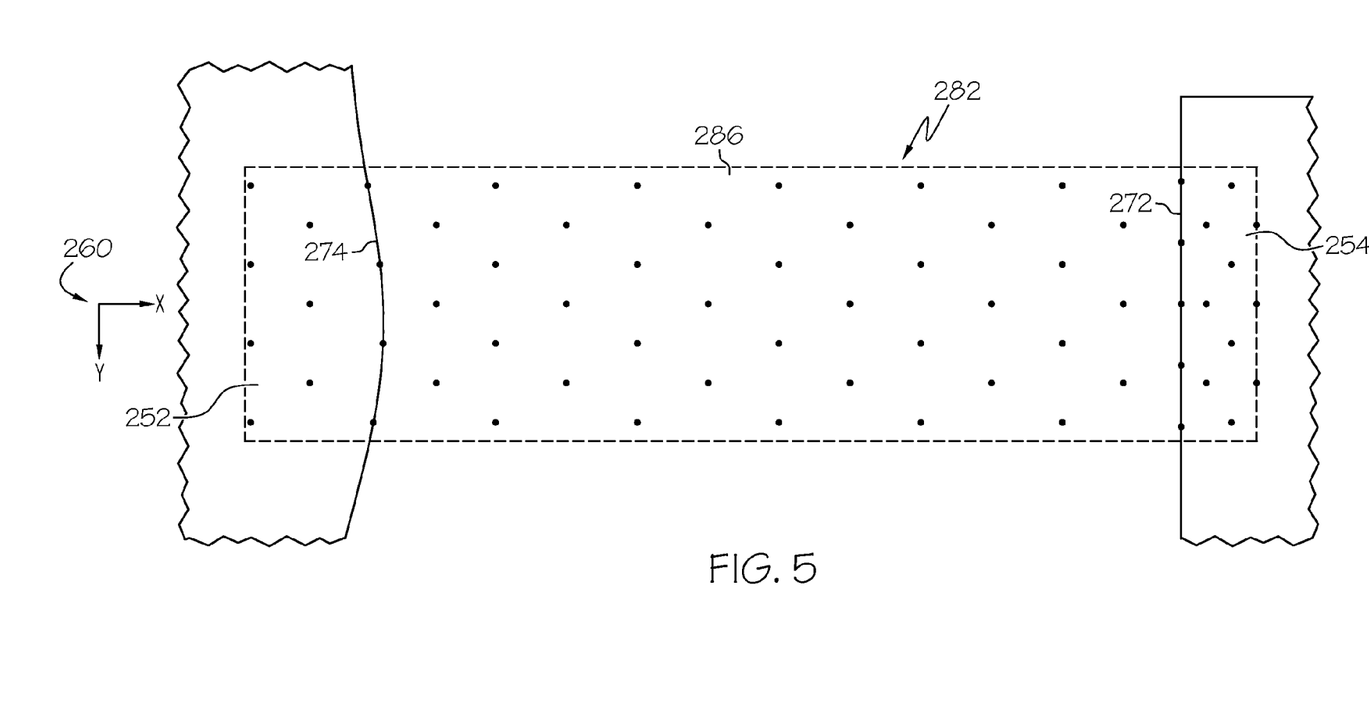
FIG. 5 is a magnified view of a reference area within the partial finite element mesh of FIG. 4.

FIG. 5 is a magnified view of reference area 282 within partial mesh 250 (FIG. 4). As depicted, reference area 282 includes portions of binder mesh 252, part mesh 254, and a preliminary addendum mesh 286. Binder mesh 252 includes a plurality of binder mesh nodes and is separated from preliminary addendum mesh 286 by binder mesh boundary 274. Part mesh 254 includes a plurality of part mesh nodes and is separated from preliminary addendum mesh 286 by part mesh boundary 272.

Preliminary addendum mesh 286 includes a plurality of addendum mesh nodes disposed between part mesh boundary 272 and binder mesh boundary 274 and having a substantially uniform distribution with respect to the xy-plane of coordinate system 260. In one embodiment, the positions and distribution of these addendum mesh nodes are determined based on the positions and distribution of the binder mesh nodes within binder mesh 252. However, it should be noted that preliminary addendum mesh 286 may be generated using other techniques for generating a plurality of addendum mesh nodes positioned within region 280 (FIG. 4).

Figure 6:
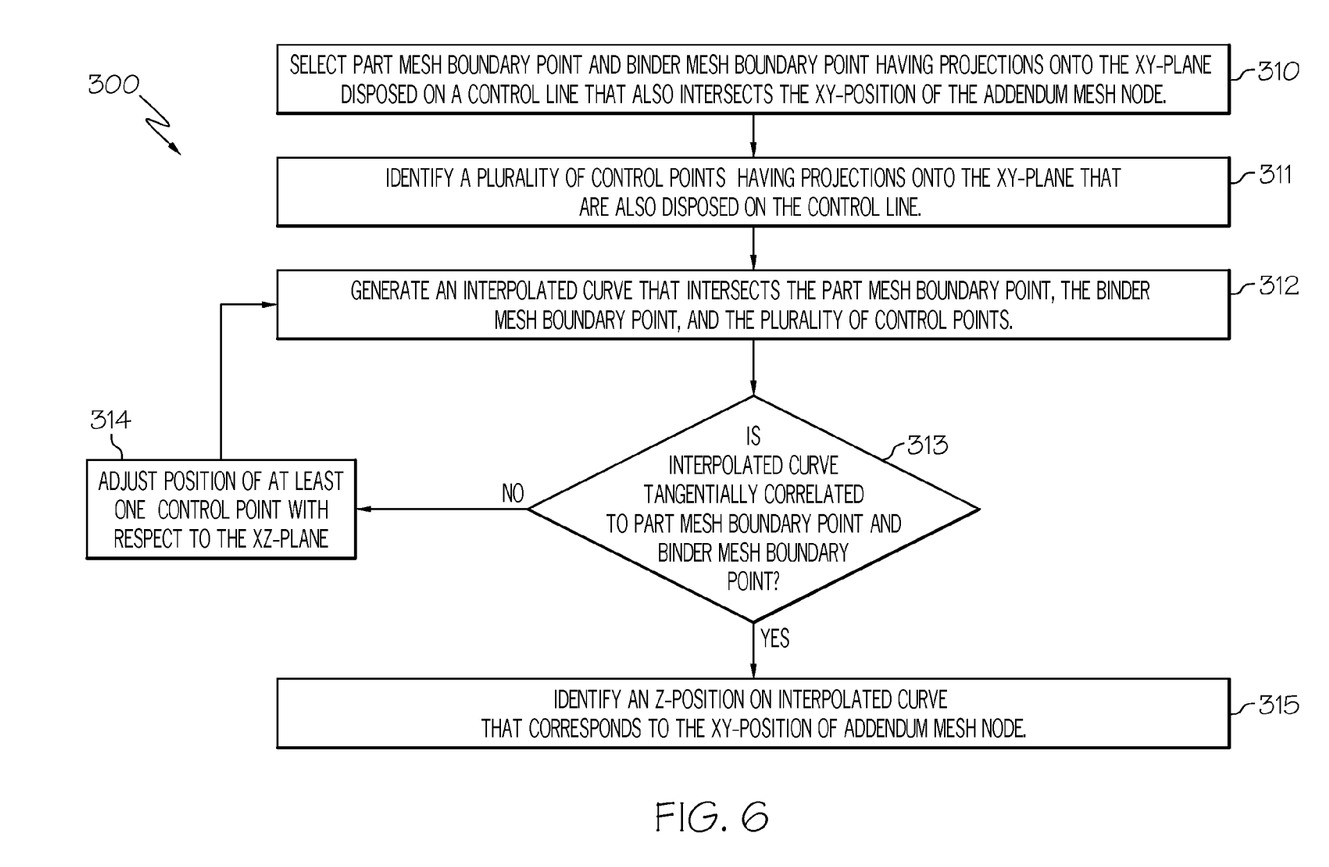
FIG. 6 is a flowchart of an exemplary method for determining a z-position for an addendum mesh node.

FIG. 6 is a flowchart of an exemplary method 300 for determining the z-position of an addendum mesh node that is disposed between a binder mesh boundary (e.g., binder mesh boundary 274 of FIG. 4) and part mesh boundary (e.g., part mesh boundary 272 of FIG. 4). As noted above, the steps of method 300 may be performed or executed by a processor (e.g., processor 106 of FIG. 2) during the creation of an addendum mesh (e.g., addendum mesh 234 of FIG. 3).

During step 310 of method 300, the processor selects corresponding points on the part mesh boundary and the binder mesh boundary (hereinafter, the "part mesh boundary point" and the "binder mesh boundary point," respectively). The part mesh boundary point and the binder mesh boundary point have projections onto a first plane (e.g., an xy-plane that is substantially parallel to the horizontal plane of the corresponding mesh) that are disposed on a control line. This control line also intersects the xy-position of the addendum mesh node. Next, the processor selects a plurality of control points (step 311), each having a projection onto the xy-plane that is also disposed on the control line. During step 312, the processor generates an interpolated curve that intersects the part mesh boundary point, the binder mesh boundary point, and the plurality of control points. The interpolated curve has a linear projection onto the xy-plane and is disposed on a second plane that is substantially orthogonal to the xy-plane. The processor then analyzes the interpolated curve to determine if it is tangentially correlated to the part mesh boundary point and the binder mesh boundary point (step 313). If the interpolated curve is not tangentially correlated to the part mesh boundary point and the binder mesh boundary point, the processor adjusts the position of at least one of the plurality of control points with respect to the second plane (step 314) and returns to step 312. Alternatively, if the interpolated curve is tangentially correlated to the part mesh boundary point and to the binder mesh boundary point, the processor identifies a z-position that intersects the interpolated curve and that corresponds to the xy-position of the addendum mesh node.

Figure 7:
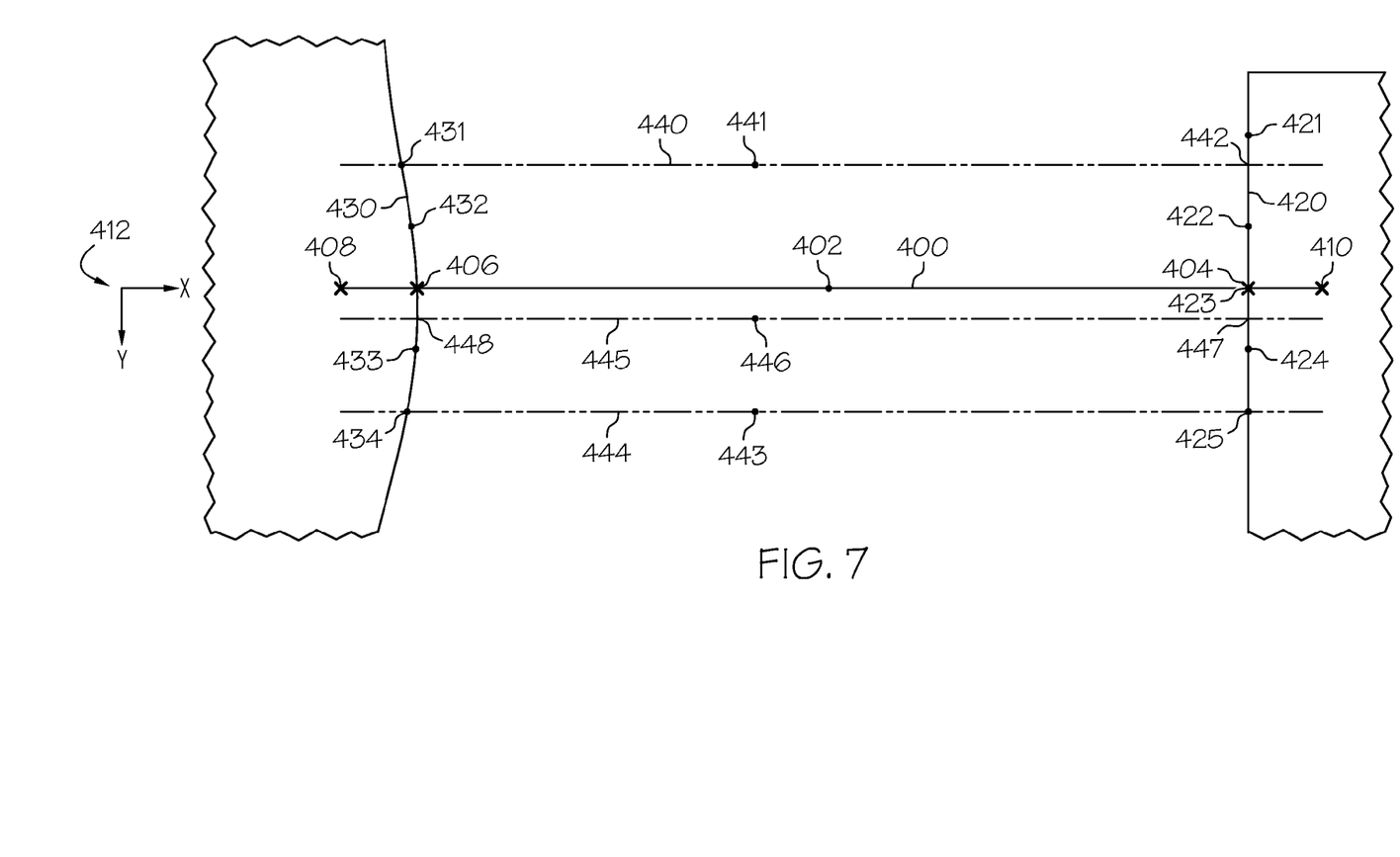
FIG. 7 depicts a control line that intersects an addendum mesh node, a part mesh boundary point, a binder mesh boundary point, and a plurality of control points.

FIG. 7 depicts a control line 400 that intersects an addendum mesh node 402, a part mesh boundary point 404, a binder mesh boundary point 406, and a plurality of control points 408, 410. These items are viewed, and will be described herein, with respect to the xy-plane of a coordinate system 412 (e.g., as though each position were projected onto the xy-plane). The xy-plane of coordinate system 412 is substantially parallel to the horizontal plane of the corresponding mesh (e.g., partial mesh 250 of FIG. 4).

Part mesh boundary point 404 is disposed on a part mesh boundary 420. Part mesh boundary 420 is a portion of a part mesh boundary that substantially corresponds to the portion of part mesh boundary 272 depicted in FIG. 5. In one embodiment, part mesh boundary 420 is a polygonal curve (or polyline) that includes a plurality of continuous points having interpolated positions between the neighboring part mesh edge nodes 421, 422, 423, 424, and 425. The surface normal for each interpolated point on part mesh boundary 420 is determined by interpolating between the surface normals of the neighboring part mesh edge nodes 421-425 using the same ratio that was used to determine the interpolated position of the point.

Binder mesh boundary point 406 is disposed on a binder mesh boundary 430. Binder mesh boundary 430 is a portion of a binder mesh boundary that substantially corresponds to the portion of binder mesh boundary 274 depicted in FIG. 5. In one embodiment, binder mesh boundary 430 is a polygonal curve (or polyline) that includes a plurality of continuous points having interpolated positions between the neighboring binder mesh edge nodes 431, 432, 433, 434. The surface normal for each interpolated point on binder mesh boundary 430 is determined by interpolating between the surface normals of the neighboring binder mesh edge nodes 431-434 using the same ratio that was used to determine the interpolated position of the point.

Addendum mesh node 402 is disposed between part mesh boundary point 404 and binder mesh boundary point 406. In one embodiment, addendum mesh node 402 is one of a plurality of addendum mesh nodes within a preliminary addendum mesh (e.g., preliminary addendum mesh 286).

With reference to FIGS. 6 and 7, part mesh boundary point 404 and binder mesh boundary point 406 are selected during step 310 of method 300. Control line 400 intersects the selected part mesh boundary point 404 on one side of addendum mesh node 402 and the selected binder mesh boundary point 406 on opposite side of addendum mesh node 402. It should be noted that control line 400 does not intersect part mesh boundary 420 or binder mesh boundary 430 at any point between the selected part mesh boundary point 404 and binder mesh boundary point 406.

Various criteria may be utilized to select a part mesh boundary point and the binder mesh boundary point during step 310. In a first embodiment, part mesh boundary point 404 is selected by identifying a position on part mesh boundary 420 that corresponds to a part mesh edge node 421-425. For example, the part mesh boundary point 404 that corresponds to the part mesh edge node 423 having an xy-position that is closest to the xy-position of addendum mesh node 402 may be selected. In this case, the corresponding binder mesh boundary point 406 is the point on binder mesh boundary 430 that is intersected by a control line 400 that also intersects the selected part mesh boundary point 404 and addendum mesh node 402. Binder mesh boundary point 406 may correspond to the position of a binder mesh edge node 431-434 or, as depicted, it may be disposed between the binder mesh edge nodes 431-434.

In a second embodiment, a binder mesh boundary point is selected first by identifying a position on binder mesh boundary 430 that corresponds to a binder mesh edge node 431-434. For example, a binder mesh boundary point that corresponds to the binder mesh edge node that is closest to addendum mesh node 402 with respect to the xy-plane may be selected. The corresponding part mesh boundary point is the point on part mesh boundary 420 that is intersected by a control line that also intersects the selected binder mesh boundary point and the addendum mesh node. Line 440 is an example of a control line that may be generated during step 310 in accordance with this second embodiment. As depicted, line 440 intersects an addendum mesh node 441, the binder mesh edge node 431 that is closest to addendum mesh node 441 with respect to the xy-plane, and a corresponding binder mesh boundary point 442.

In a third embodiment, a part mesh edge node (e.g., part mesh edge node 425) and a binder mesh edge node (e.g., binder mesh edge node 434) having collinear positions with respect to the xy-plane are selected during step 310. In this case, the position of an addendum mesh node 443 is interpolated onto a control line (e.g., line 444) that intersects the selected part mesh edge node 425 and the selected binder mesh edge node 434.

Finally, in a fourth embodiment the part mesh boundary point may be any point on part mesh boundary 420. For example, the selected part mesh boundary point may correspond to a position on part mesh boundary 420 that is closest to addendum mesh node 402 with respect to the xy-plane of coordinate system 412. The corresponding binder mesh boundary point is the point on binder mesh boundary 430 that is intersected by a control line that also intersects the selected part mesh boundary point and the addendum mesh node. Line 445 is an example of a control line that may be generated during step 310 in accordance with this fourth embodiment. As depicted, line 445 intersects an addendum mesh node 446, the part mesh boundary point 447 that is closest to addendum mesh node 446 with respect to the xy-plane, and a corresponding binder mesh boundary point 448.

Control points 408 and 410 are selected during step 311 of method 300. In the depicted embodiment, control points 408 and 410 have projections onto the xy-plane that are disposed on opposite sides of control line 400. The initial z-position for control points 408 and 410 may be the same as the z-positions for binder mesh boundary point 406 and part mesh boundary point 404, respectively. Alternatively, the initial z-position for control points 408 and 410 may be set to a default value. Although the depicted embodiment includes two control points 408, 410 having projections onto the xy-plane of coordinate system 412, alternative embodiments may include other control point arrangements. For example, in one alternative embodiment, one or more control points may be positioned between binder mesh boundary point 406 and addendum mesh node 402 and one or more additional control points may be positioned between part mesh boundary point 404 and addendum mesh node 402.

Figure 8:
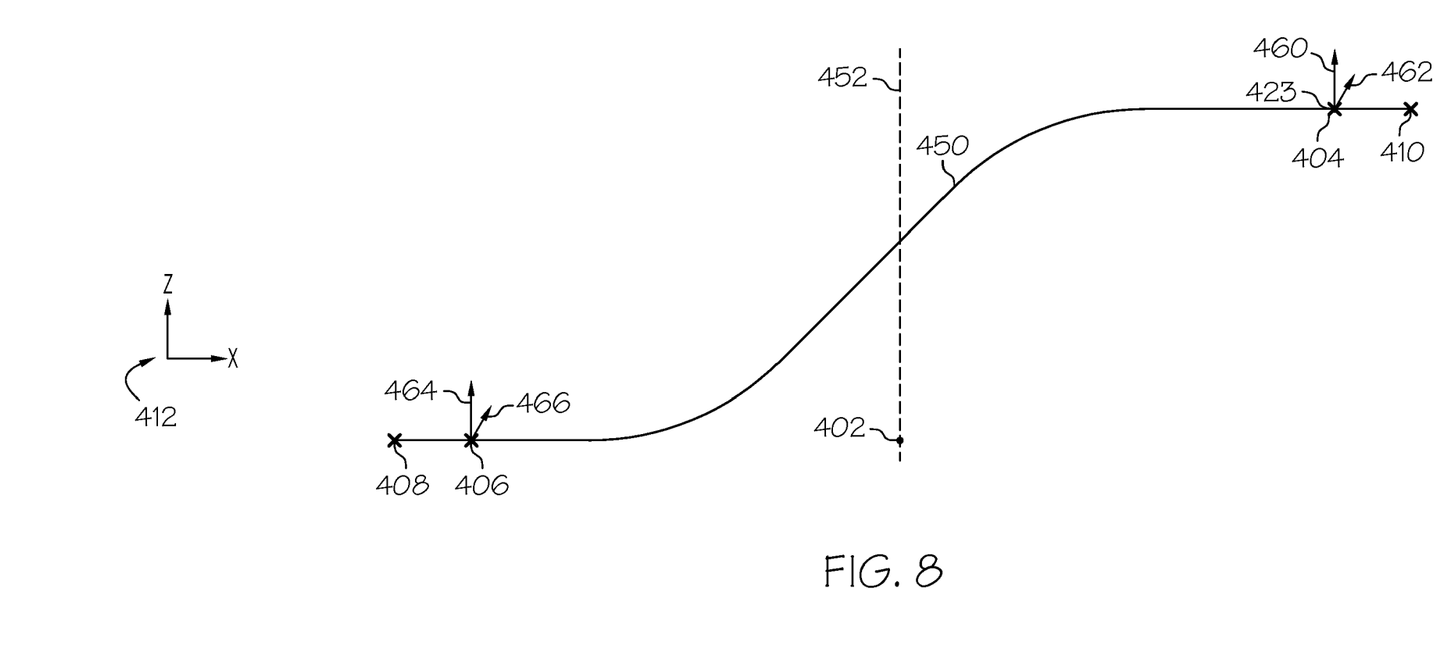
FIG. 8 depicts a first interpolated curve that intersects a part mesh boundary point, a binder mesh boundary point, and a plurality of control points.

FIG. 8 depicts a first interpolated curve 450 that intersects part mesh boundary point 404, binder mesh boundary point 406, and control points 408, 410. In addition, curve 450 intersects the x-position 452 of addendum mesh node 402. These items are viewed, and will be discussed herein, with respect to the xz-plane of coordinate system 412 (e.g., as though projected onto the xz-plane of coordinate system 412). It will be appreciated that curve 450 has a linear projection onto the xy-plane of coordinate system 412 (FIG. 7) that corresponds to control line 400 (FIG. 7). Accordingly, the xy-position of each point on curve 450 will be substantially the same as a corresponding point on control line 400 (FIG. 7) and may be determined using a linear equation having the form:

$$ax^2+by^2+c=0 \quad\quad\quad (Eq.\ 1)$$

where $a^2+b^2=0$ and $c<0$.

With reference to FIGS. 6 and 8, curve 450 is generated during step 312 of method 300 using any technique for generating an interpolated curve that is differentiable at every point and that intersects a plurality of predetermined data points (e.g., part mesh boundary point 404, binder mesh boundary point 406, and control point 408, 410). In one embodiment, curve 450 is generated using a radial basis function (RBF) for generating interpolated curves that are differentiable at every point. In this case, part mesh boundary point 404, binder mesh boundary point 406, and control points 408-410 comprise RBF data points (or RBF knot points).

In one example, curve 450 ($r$) is described by the equation:

$$r(x,y)=[x,y,z(x,y)] \quad\quad\quad (Eq.\ 2)$$

In this case, $z(x,y)$ comprises a multi-quadratic RBF function having the form:

$$z(x,y) = \sum_{i=1}^{N} w_i \phi(x,y)$$
$$= \sum_{i=1}^{N} w_i((x-x_i)^2 + (y-y_i)^2 + r_o^2)^{\frac{1}{2}}$$

where:

$x-x_i$ is the radial distance between the x-position of the current curve point and the x-position of the ith RBF data point;

$y-y_i$ is the radial distance between the y-position for the current curve point and the y-position of the ith RBF data point;

$r_0$ is a constant shape factor; and $w_i$ is determined by solving the N linear equations generated for each RBF data point.

During step 313 of method 300, curve 450 is analyzed to determine if it is tangentially correlated to part mesh boundary point 404 and the binder mesh boundary point 406. Curve 450 is tangentially correlated to part mesh boundary point 404 when the curve normal 460 at the position of part mesh boundary point 404 corresponds to the surface normal 462 of part mesh boundary point 404. Further, curve 450 is tangentially correlated to binder mesh boundary point 406 when the curve normal 464 at the position of binder mesh boundary point 406 corresponds to the surface normal 466 of binder mesh boundary point 406. In the depicted embodiment, curve 450 is not tangentially correlated to part mesh boundary point 404 and binder mesh boundary point 406. Accordingly, method 300 proceeds to step 314 and the position of at least one of control point 408, 410 is adjusted with respect to the xz-plane of coordinate system 412.

Figure 9:
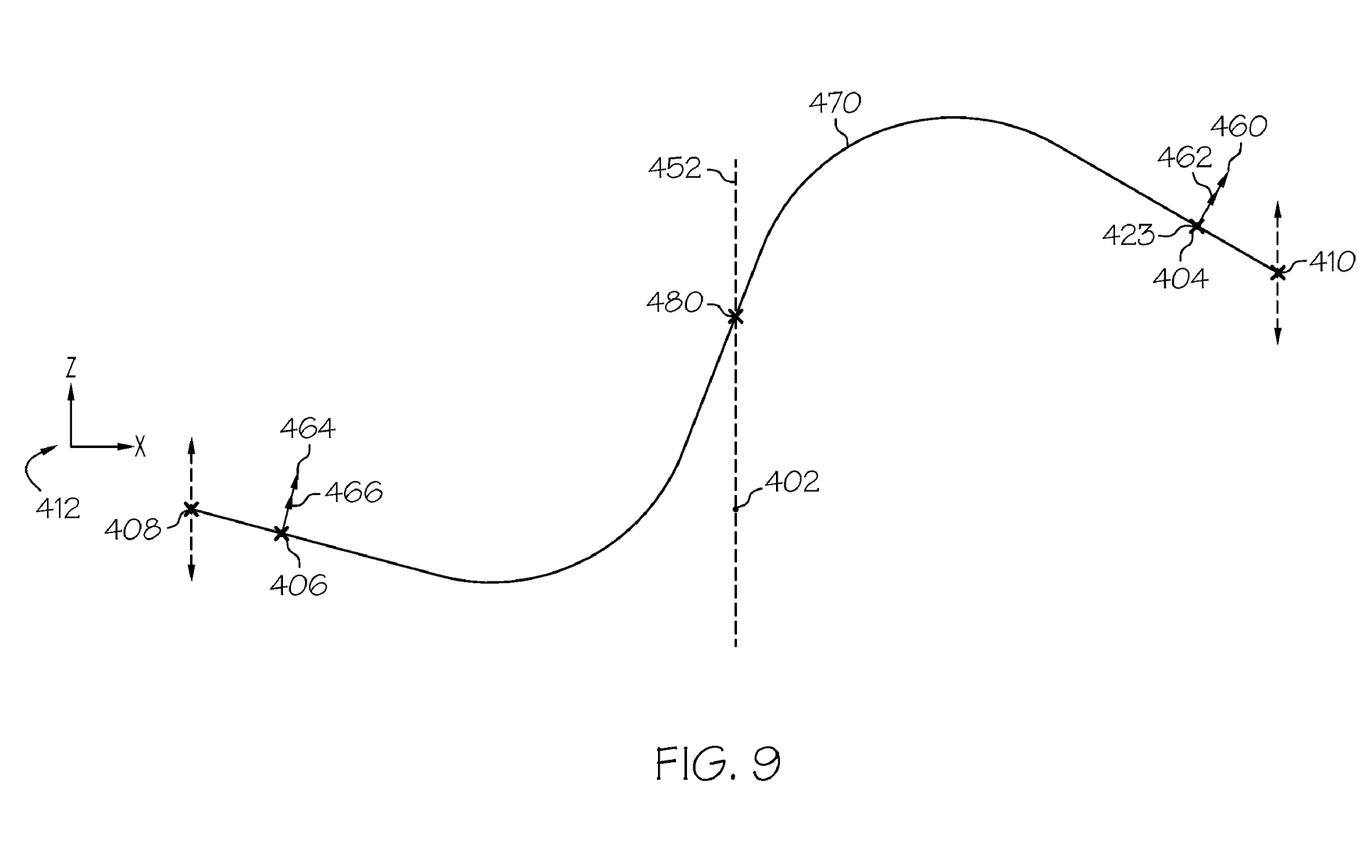
FIG. 9 depicts a second interpolated curve that intersects a part mesh boundary point, a binder mesh boundary point, and the adjusted positions of a plurality of control points.

FIG. 9 depicts a second interpolated curve 470 that intersects part mesh boundary point 404, binder mesh boundary point 406, and adjusted control points 408, 410. As depicted, these items are viewed, and will be discussed herein, with respect to the xz-plane of coordinate system 412. With reference to FIGS. 6 and 9, the positions of control points 408 and 410 are adjusted with respect to the xz-plane during step 314 of method 300. For example, in the depicted embodiment the z-positions of control points 408 and 410 are adjusted. Thus, the positions of the adjusted control points 408, 410 are still disposed on control line 400 (FIG. 7) with respect to the xy-plane of coordinate system 412 (FIG. 7).

Steps 312, 313, and 314 are repeated until an interpolated curve is identified during step 313 that tangentially corresponds to part mesh boundary point 404 and binder mesh boundary point 406. In the depicted embodiment, curve 470 is generated during a subsequent iteration of step 312. As shown, curve 470 is tangentially correlated to part mesh boundary point 404 because the curve normal 460 at the position of part mesh boundary point 404 corresponds to the surface normal of part mesh boundary point 404. Further, curve 470 is also tangentially correlated to binder mesh boundary point 406 because the curve normal 464 at the position of binder mesh boundary point 406 corresponds to the surface normal at binder mesh boundary point 406. Accordingly, method 300 will proceed to step 315 when curve 470 is analyzed during step 313.

During step 315 of method 300, a z-position is identified on curve 470 that correspond to the xy-position of addendum mesh node 402. In the depicted embodiment, curve 470 intersects the x-position 452 of addendum mesh node 402 at point 480. Thus, the z-position of point 480 corresponds to the xy-position of addendum mesh node 402 and is identified during step 315.

In one embodiment, a single iteration of method 300 is performed or executed to determine the z-position of addendum mesh node 402. In this case, z-position identified during step 315 of the single iteration of method 300 is assigned to addendum mesh node 402. Method 300 is then repeated for each, or a portion, of the remaining addendum mesh nodes. For example, where addendum mesh node 402 is part of a preliminary addendum mesh (e.g., preliminary addendum mesh 286 of FIG. 5), a single iteration of method 300 is performed to determine the z-position for all, or for a portion of, the remaining addendum mesh nodes within the preliminary mesh.

Alternatively, a plurality of iterations of method 300 are performed or executed to determine the z-position of addendum mesh node 402. In this case, unique pairs of part mesh boundary points and binder mesh boundary points are selected during step 310 of each iteration of method 300 using the selection criteria described above. Method 300 may be repeated for a predetermined number of part mesh boundary points selected using the criteria described above, for each part mesh boundary point selected using the criteria described above and having an xy-position that is less than a threshold distance from the xy-position of addendum mesh node 402, or for each part mesh boundary point selected using the criteria described above and corresponding to a control line that also intersects addendum mesh node 402 and a corresponding binder mesh boundary point.

Figure 10:
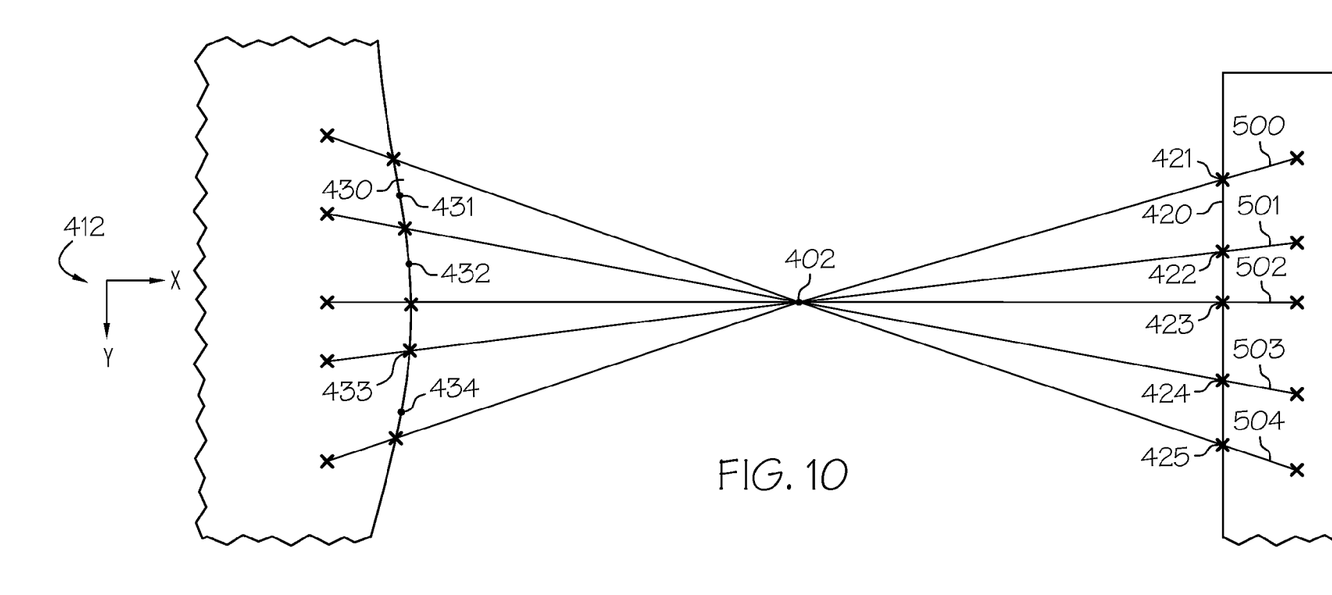
FIG. 10 depicts a plurality of control lines that each intersect an addendum mesh node, a point on a part mesh boundary, and a corresponding point on a binder mesh boundary.

FIG. 10 depicts a plurality of control lines 500, 501, 502, 503, 504 that each intersect addendum mesh node 402, a point on part mesh boundary 420 that corresponds to the position of part mesh edge nodes 421-425, and a corresponding point on binder mesh boundary 430. Control lines 500-504 are generated during step 310 using the selection criteria of the first embodiment described above with reference to FIG. 7. It will be appreciated that a z-position (hereinafter, an "intermediate z-position") is identified during an iteration of step 315 that corresponds to each control line 500-504. The z-position of addendum mesh node 402 is based on these intermediate z-positions.

In one embodiment, a weighted average of the intermediate z-positions is generated and assigned to addendum mesh node 402. In this case, each intermediate z-position is assigned a weight that is based on the distance between the xy-positions of the corresponding part mesh boundary point (e.g., the part mesh boundary point that is disposed on the corresponding control line 500-504) and addendum mesh node 402. These weights are then utilized to generate the weighted average of intermediate z-positions that is assigned to addendum mesh node 402. It should be noted that the weight of each intermediate z-position may be based on other factors as well, such as the distance between the xy-positions of the corresponding binder mesh point and addendum mesh node 402. Further, it will also be appreciated that other approaches may be utilized to determine the z-position of addendum mesh node 402 based on the intermediate z-positions. For example, the z-position of addendum mesh node 402 may be the average (non-weighted) of the intermediate z-positions.

In this alternative embodiment, a plurality of iterations of method 300 are performed or executed for each, or a portion, of the remaining addendum mesh nodes. For example, where addendum mesh node 402 is part of a preliminary addendum mesh (e.g., preliminary addendum mesh 286 of FIG. 5), method 300 is performed or executed a plurality of times to determine a z-position for all, or for a portion of, the remaining addendum mesh nodes within this preliminary mesh.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for determining a position of an addendum mesh node disposed between a part mesh boundary and a binder mesh boundary with respect to a first plane, the method comprising:
    selecting a first point on the part mesh boundary and a second point on the binder mesh boundary having positions with respect to the first plane that are disposed on a control line, wherein the control line also intersects the position of the addendum mesh node with respect to the first plane, wherein the part mesh boundary and the binder mesh boundary are designed for a deep-drawing process, wherein the first plane is substantially parallel to a drawn blank associated with the deep-drawing process;
    identifying a plurality of control points having positions with respect to the first plane that are disposed on the control line;
    generating an interpolated curve that intersects the first point, the second point, and the plurality of control points by using a radial basis function (RBF), wherein the first point, the second point, and the plurality of control points comprise RBF data points;
    adjusting the position of at least one of the plurality of control points with respect to a second plane that is substantially orthogonal to the first plane and repeating the step of generating the interpolated curve until the interpolated curve is tangentially correlated to the first point and to the second point; and
    identifying a position on the interpolated curve that corresponds to the position of the addendum mesh node with respect to the first plane;
    repeating each step a plurality of times, wherein a different first point is selected during each repeated selecting step; and determining a weighted average position of the addendum mesh node based on the positions identified during each repeated identifying step, wherein the positions identified share the same position with respect to the first plane.

2. The method of claim 1, wherein the part mesh boundary comprises a plurality of part mesh edge nodes and the step of selecting further comprises selecting a first point that corresponds to the position of one of the plurality of part mesh edge nodes.

3. The method of claim 1, wherein the binder mesh boundary further comprises a plurality of binder mesh edge nodes and the step of selecting further comprises selecting a second point that corresponds to the position of one of the plurality of binder mesh edge nodes.

4. The method of claim 1, wherein the part mesh boundary comprises a plurality of part mesh edge nodes, the binder mesh boundary comprises a plurality of binder mesh edge nodes, and the step of selecting further comprises:
    selecting a first point that corresponds to the position of one of the plurality of part mesh edge nodes; and
    selecting a second point that corresponds to the position of one of the plurality of binder mesh edge nodes.

5. The method of claim 1, wherein each point on the part mesh boundary and the binder mesh boundary is associated with a surface normal and the step of adjusting further comprises:
    adjusting the position of at least one of the plurality of control points and repeating the step of generating the interpolated curve until:
        the normal of the interpolated curve at the first point corresponds to the surface normal of the part mesh boundary at the first point; and
        the normal of the interpolated curve at the second point corresponds to the surface normal of the binder mesh boundary at the second point.

6. The method of claim 1, wherein the step of determining the position of the addendum mesh node further comprises generating the weighted average of the positions identified during each repeated identifying step, wherein the weight of each determined position is based on the distance between the positions with respect to the first plane of the corresponding part mesh boundary point and the addendum mesh node.

7. The method of claim 1, wherein the step of generating the interpolated curve further comprises generating an interpolated curve that is differentiable at every point and that intersects the first point, the second point, and the plurality of control points.

8. The method of claim 7, wherein the first plane is substantially parallel to the xy-plane of a coordinate system having substantially orthogonal x, y, and, z-axes, the interpolated curve has a linear projection onto the xy-plane, and the step of generating the interpolated curve further comprises:

determining x and y positions within the coordinate system that correspond to each point on the interpolated curve based on the linear projection of the interpolated curve onto the xy-plane; and determining a z-position within the coordinate system for each point on the interpolated curve based on a multi-quadratic RBF function having the form:

$$z(x, y) = \sum_{i=1}^{N} w_i \phi(x, y) = \sum_{i=1}^{N} w_i ((x - x_i)^2 + (y - y_i)^2 + r_o^2)^{\frac{1}{2}}$$

wherein:

N is a positive integer representing the number of RBF data points;

is the radial distance between the x-position on the interpolated curve and the x-position of the ith RBF data point;

is the radial distance between the y-position on the interpolated curve and the y-position of the ith RBF data point;

r0 is a constant shape factor; and wi is determined by solving the N linear equations generated for each RBF data point.

9. The method of claim 1, wherein the step of selecting the plurality of control points further comprises selecting a first control point and a second control point having positions with respect to the first plane that are disposed on opposite sides of the first point and the second point.

10. The method of claim 1, wherein the first plane is substantially parallel to the xy-plane of a coordinate system having substantially orthogonal x, y, and z-axes and the step of identifying further comprises identifying a z-position within the coordinate system that corresponds to a point on the interpolated curve and that corresponds to the position of the addendum mesh node with respect to the xy-plane.

11. A non-transitory computer readable medium having instructions stored thereon that when executed by a processor cause the processor to perform a method for determining a position of an addendum mesh node that is disposed between the part mesh boundary and the binder mesh boundary of a finite element mesh for a drawn blank, the method comprising:

selecting a first point on the part mesh boundary and a second point on the binder mesh boundary having projections onto a first plane that are disposed on a control line, wherein the first plane is substantially parallel to a horizontal plane of the finite element mesh and the control line intersects the position of the addendum mesh node with respect to the first plane, wherein the part mesh boundary and the binder mesh boundary are designed for a deep-drawing process, wherein the first plane is substantially parallel to the drawn blank associated with the deep-drawing process;

identifying a plurality of control points having projections onto the first plane that are disposed on the control line;

generating an interpolated curve having a linear projection onto the first plane and intersecting the first point, the second point, and the plurality of control points by using a radial basis function (RBF), wherein the first point, the second point, and the plurality of control points comprise RBF data points;

adjusting the position of at least one of the plurality of control points with respect to a second plane that is substantially orthogonal to the first plane and repeating the step of generating the interpolated curve until the interpolated curve is tangentially correlated to the first point and to the second point; and identifying a position that is disposed on the interpolated curve and that corresponds to the position of the addendum mesh node with respect to the first plane;

repeating each step a plurality of times, wherein a different first point is selected during each repeated selecting step; and determining a weighted average position of the addendum mesh node based on the positions identified during each repeated identifying step, wherein the positions identified share the same position with respect to the first plane.

12. The non-transitory computer readable storage medium of claim 11, wherein the part mesh boundary comprises a plurality of part mesh edge nodes and the step of selecting a part mesh edge node further comprises selecting a first point that corresponds to the position of a part mesh edge node.

13. The non-transitory computer readable storage medium of claim 11, wherein each point on the part mesh boundary and the binder mesh boundary is associated with a surface normal and the step of adjusting further comprises:

adjusting the positions of at least one of the plurality of control points and repeating the step of generating the interpolated curve until:

the normal of the interpolated curve at the first point corresponds to the surface normal of the part mesh boundary at the first point; and the normal of the interpolated curve at the second point corresponds to the surface normal of the binder mesh boundary at the second point.

14. The non-transitory computer readable storage medium of claim 13, wherein the method further comprises the steps of:

repeating each step a plurality of times, wherein a different first point is selected during each repeated selecting step; and generating a weighted average of the positions identified during each repeated identifying step, wherein the weight of each identified position is based on the distance between the positions with respect to the first plane of the corresponding first point and the addendum mesh node.

15. The non-transitory computer readable storage medium of claim 14, wherein the step of selecting the plurality of control points further comprises selecting a first control point and a second control point having positions with respect to the first plane that are disposed on opposite sides of the first point and the second point.

16. A method for determining a z-position of an addendum mesh node within a coordinate system having substantially orthogonal x, y, and z-axes, wherein the addendum mesh node is disposed between the part mesh boundary and the binder mesh boundary of a finite element mesh for a drawn blank having a horizontal plane that is substantially parallel to the xy-plane of the coordinate system, the method comprising:

(a) selecting a first point on the part mesh boundary and a second point on the binder mesh boundary having projections onto the xy-plane that are disposed on a control line that also intersects the xy-position of the addendum mesh node, wherein the part mesh boundary and the binder mesh boundary are designed for a deep-drawing process;

(b) selecting a first control point and a second control point having projections onto the xy-plane that are disposed on the control line;

(c) generating an interpolated curve having a linear projection onto the xy-plane and intersecting the first point, the second point, the first control point, and the second control point by using a radial basis function (RBF), wherein the first point, the second point, and the plurality of control points comprise RBF data points;

(d) adjusting the z-position of at least one of the first control point and the second control point and repeating step (c) until: the normal of the interpolated curve at the first point corresponds to the surface normal of the part mesh boundary at the first point; and the normal of the interpolated curve at the second point corresponds to the surface normal of the binder mesh boundary at the second point; and (e) identifying a z-position on the interpolated curve that corresponds to the xy-position of the addendum mesh node;

repeating steps (a)-(e) a plurality of times, wherein a different first point is selected during each iteration of step (a), and the addendum maintain the same xy-position; and generating a weighted average of the positions identified during each repeated step (e), wherein the weight of each position is based on the distance between the xy-positions of the corresponding first point and the addendum mesh node.

\* \* \* \* \*